(12) United States Patent
Huang et al.

(10) Patent No.: US 7,901,864 B2
(45) Date of Patent: *Mar. 8, 2011

(54) RADIATION-SENSITIVE COMPOSITION AND METHOD OF FABRICATING A DEVICE USING THE RADIATION-SENSITIVE COMPOSITION

(75) Inventors: Wu-Song Huang, Poughkeepsie, NY (US); Marie Angelopoulos, Cortlandt Manor, NY (US); Timothy A. Brunner, Ridgefield, CT (US); Dirk Pfeiffer, Dobbs Ferry, NY (US); Ratnam Sooriyakumaran, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 1253 days.

This patent is subject to a terminal disclaimer.

(21) Appl. No.: 10/948,826

(22) Filed: Sep. 23, 2004

(65) Prior Publication Data

US 2006/0063103 A1 Mar. 23, 2006

(51) Int. Cl.
*G03C 1/00* (2006.01)
*H01L 21/00* (2006.01)
*G03F 1/00* (2006.01)

(52) U.S. Cl. .............. 430/270.1; 430/311; 430/313; 430/326; 430/330; 430/331

(58) Field of Classification Search ......... 430/270.1, 430/311, 314, 326, 322, 313, 323, 330, 331, 430/905, 926; 556/460, 425, 439, 449; 528/30, 528/31, 32, 37
See application file for complete search history.

(56) References Cited

U.S. PATENT DOCUMENTS

| | | | | |
|---|---|---|---|---|
| 5,338,818 A | * | 8/1994 | Brunsvold et al. | 528/43 |
| 5,484,867 A | * | 1/1996 | Lichtenhan et al. | 528/9 |
| 5,691,110 A | * | 11/1997 | Bohrer et al. | 430/270.1 |
| 6,197,473 B1 | * | 3/2001 | Kihara et al. | 430/192 |
| 6,210,856 B1 | | 4/2001 | Lin et al. | 430/270.1 |
| 6,420,084 B1 | * | 7/2002 | Angelopoulos et al. | 430/270.1 |
| 6,420,088 B1 | | 7/2002 | Angelopoulos et al. | 430/272.1 |
| 6,461,789 B1 | * | 10/2002 | Hatakeyama et al. | 430/270.1 |
| 6,468,712 B1 | | 10/2002 | Fedynyshyn | 430/270.1 |
| 6,503,686 B1 | | 1/2003 | Fryd et al. | 430/270.1 |
| 6,509,134 B2 | | 1/2003 | Ito et al. | 430/270.1 |
| 6,548,219 B2 | | 4/2003 | Ito et al. | 430/270.1 |
| 6,632,582 B2 | | 10/2003 | Kishimura et al. | 430/270.1 |
| 6,724,091 B1 | * | 4/2004 | Jayaraman et al. | 257/778 |

(Continued)

OTHER PUBLICATIONS

"Chemically Amplified Resists: Past, Present, and Future"; Author: Hiroshi Ito; Part of SPIE Conference on Advances in Resist Technology and Processing XVI; Mar. 1999, SPIE vol. 3678.

*Primary Examiner* — Cynthia H Kelly
*Assistant Examiner* — Connie P Johnson
(74) *Attorney, Agent, or Firm* — McGinn IP Law Group, PLLC

(57) ABSTRACT

A radiation-sensitive composition (and method of fabricating a device using the composition) includes a nonpolymeric silsesquioxane including at least one acid labile moiety, a polymer including at least one member selected from the group consisting of an aqueous base soluble moiety and an acid labile moiety, and a radiation-sensitive acid generator. Another radiation-snsteive composition (and method of fabricating a device using the composition) includes a nonpolymerc silsesquioxane including at least one aqueous base soluble moiety, a polymer including an aqueous base soluble moiety, a crosslinker, and a radiation-sensitive acid generator.

28 Claims, 3 Drawing Sheets

U.S. PATENT DOCUMENTS

| | | |
|---|---|---|
| 6,759,460 B2 * | 7/2004 | Kamo et al. .................. 524/100 |
| 6,946,736 B2 * | 9/2005 | Gleason et al. ............... 257/758 |
| 6,994,946 B2 * | 2/2006 | Hatakeyama et al. ...... 430/270.1 |
| 7,008,750 B2 * | 3/2006 | Barclay et al. ............. 430/270.1 |
| 7,141,692 B2 * | 11/2006 | Allen et al. .................... 556/460 |
| 2002/0013059 A1 * | 1/2002 | Kishimura et al. ........... 438/694 |
| 2002/0090572 A1 * | 7/2002 | Sooriyakumaran et al. ............................. 430/271.1 |
| 2002/0102490 A1 | 8/2002 | Ito et al. |
| 2002/0146638 A1 | 10/2002 | Ito et al. |
| 2002/0146639 A1 | 10/2002 | Brock et al. |
| 2002/0164538 A1 | 11/2002 | Allen et al. |
| 2002/0182541 A1 | 12/2002 | Gonsalves |
| 2003/0171490 A1 | 9/2003 | Breyta et al. |
| 2003/0207208 A1 | 11/2003 | Uenishi |
| 2004/0120915 A1 * | 6/2004 | Yang et al. ................. 424/70.13 |
| 2005/0112382 A1 * | 5/2005 | Allen et al. .................... 428/447 |

* cited by examiner

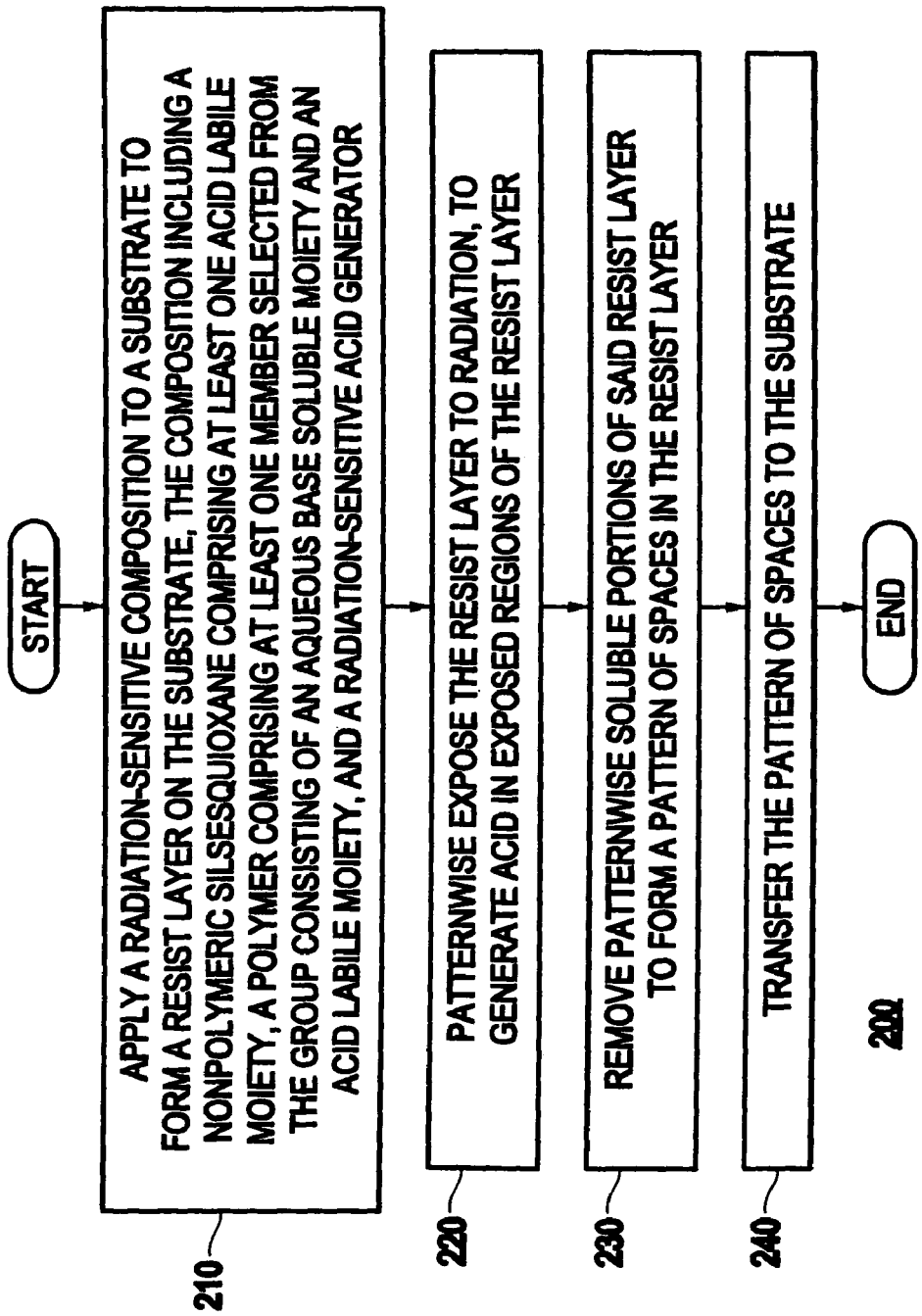

RADIATION-SENSITIVE COMPOSITION AND METHOD OF FABRICATING A DEVICE USING THE RADIATION-SENSITIVE COMPOSITION

CROSS REFERENCE TO RELATED APPLICATIONS

The present application is related to U.S. patent application Ser. No. 10/721,302, entitled "MOLECULAR PHOTORESISTS CONTAINING NONPOLYMERIC SILSEQUIOXANES" which was filed on Nov. 24, 2003, and which is commonly assigned with the present Application and is incorporated by reference herein.

BACKGROUND OF THE INVENTION

1. Field of the Invention

The present invention relates to a radiation-sensitive composition and, more particularly, a radiation-sensitive composition which includes a nonpolymeric silsesquioxane and a polymer.

2. Description of the Related Art

In the fabrication of integrated circuits, lithography is used to generate pattern structures on the semiconductor and various materials for the construction of the desired circuit structures. A continuing demand in view of the ever increasing desire in the semiconductor industry for higher circuit density in microelectronic devices has prompted lithographic engineers to develop improved lithographic process.

The most direct method of achieving higher area density is to improve the resolution of circuit patterns in resist films. One way of improving the resolution in resist is to migrate to shorter wavelength from 365 nm to 248 nm, then to 193 and 157 nm, or to adopt non optical system such as EUV, E-beam and X-ray. The other way is to increase the numerical aperture (NA) of the lens system of the lithographic imaging tool at a given wavelength.

However, increasing the NA results in a decrease in the depth of focus (DOF) of the imaging radiation, thereby requiring a reduction in the thickness of the imaging resist film. Another reason for requiring thinner resist is that the resist images usually collapse during the developing step with aqueous base if the aspect ratio is greater than 3. However, a thin resist may not have sufficient etch masking capability.

One approach that enables the use of higher NA exposure tools as well as a thinner photoresist film is multilayer resist processing such as bilyer and trilayer resists. Bilayer resists generally comprise a top thin film imaging layer coated on a thick organic underlayer. The resist is patterned by (i) imagewise exposure and development of the top layer, and then (ii) anisotropically transferring the developed pattern in the top layer through the thick underlayer to the substrate.

Suitably, the top layer contains precursors to etch resistant oxides such as silicon, boron, germanium, or metals such as titanium, iron, tin, etc., which enable the use of oxygen-reactive ion etching (RIE) in the image transfer step. Silicon-containing resists are the most commonly used bilayer top imaging resists.

Two major type of bilayer resists are known in the art. One uses silsesquioxane polymer (SSQ polymer) as back bone, and the other uses silicon elements in the side chain. Short wavelength and high energy radiation source such as 193 nm, 157 nm and EUV cleaves bonds on the side chain causing a Si component to outgas from resist during exposure and deposit on the lens. The organic component deposited on the lens can be cleaned but not the Si component. Therefore, it is not desired to use polymers with Si components on the side chain. On the other hand, it is hard to synthesize SSQ polymer with consistent structure and molecular weight due to its various extent of condensation during polymerization.

Polyhedral oligosilsesquioxanes (POSS) has a well defined structure and no breakable side chain Si components. For example, U.S. Pat. No. 6,420,084, inter alia, discloses the linkage of the POSS unit on the side chain of a polymer in a chemically amplified resists system. U.S. application Pub. No. 20020182541 also discloses a polymer containing POSS on the side chain for a chemically amplified resist system. This patent application publication also discloses using non-active POSS (i.e. no acid labile groups attached to it), as an additive to photoresist to improve etch properties. The additive approach has the advantage of being simple and easy in formulating resists.

However, small silicon compounds have outgassing concern, while non-active POSS is a big molecule with difficulty in obtaining proper dissolution properties for resist to perfom well especially in a positive tone resist system. In the negative tone resist, the resist requires aqueous soluble properties. Most commercial POSS materials have cyclopentyl groups linked to the corner, which has no solubility in aqueous base and are only suitable for resists used in solvent developable systems.

SUMMARY OF THE INVENTION

In view of the foregoing and other problems, disadvantages, and drawbacks of the aforementioned compositions and methods, it is a purpose of the exemplary aspects of the present invention to provide, inter alia, an improved radiation-sensitive composition which may be used, for example, in a bilayer photoresist which easily manufactures consistent products and has no concern for outgassing.

An exemplary aspect of the present invention includes a radiation-sensitive composition (e.g., positive tone resist composition) which includes a nonpolymeric silsesquioxane having at least one acid labile moiety, a polymer having at least one member selected from the group consisting of an aqueous base soluble moiety and an acid labile moiety, and a radiation-sensitive acid generator.

Another exemplary aspect of the invention includes radiation-sensitive composition (e.g., negative tone resist composition) including a nonpolymeric silsesquioxane may include at least one aqueous base soluble moiety, a polymer may include an aqueous base soluble moiety, a crosslinker, and a radiation-sensitive acid generator.

For example, the nonpolymeric silsesquioxane may be selected from a group consisting of a polyhedral silsesquioxane optionally having one to three open vertices, and a macromer of two to four polyhedral silsesquioxanes that may be the same or different, with each polyhedral silsesquioxane optionally having one to three open vertices. Further, the polyhedral silsesquioxane may include from 4 to 10 faces.

Further, the acid labile moiety in the nonpolymeric silsesquioxane and the acid labile moiety in the polymer may be selected from the group consisting of ethers, acetals, ketals, ortho esters, carboxylic esters, carbonates, sulfonates. The aqueous base soluble moiety may be selected from the group consisting of a hydroxyl, a fluoroalcohol, a carboxylic acid, an amino group, and an imino group.

The polymer may be selected from the group consisting of polyphenols, polyacrylates, polymethacrylates, polycyclicolefins, cyclicolefine-maleic anhydride copolymers and the mixtures thereof. Further, the radiation-sensitive acid generator may be selected from the group consisting of nitrobenzyl compounds, sulfonium salts, iodonium salts, sulfonates, carboxlates.

Another exemplary aspect of the invention includes a method of fabricating a device. The method includes applying a radiation-sensitive composition (e.g., any of the compositions described above) to a substrate to form a resist layer on the substrate. The method further includes patternwise exposing the resist layer to radiation, to generate acid in exposed regions of the resist layer, removing patternwise soluble portions of the resist layer to form a pattern of spaces in the resist layer, and transferring the pattern of spaces to the substrate.

The method may also include baking the exposed resist layer to promote acid-catalyzed reaction in exposed portions of the resist layer subsequent to the patternwise exposing the substrate, and forming a planarizing layer over the substrate, the resist layer being applied directly to the planarizing layer. Further, transferring the pattern may include performing an anisotropic etch to transfer the pattern.

Another aspect of the present invention includes an imaging layer for patterning a substrate. The imaging layer includes the radiation-sensitive composition of the present invention.

Another aspect of the present invention includes a bilayer resist layer for patterning a substrate. The bilayer resist layer includes an underlayer formed on the substrate, and an imaging layer according the exemplary aspects of the present invention formed on the underlayer.

With its unique and novel features, the exemplary aspects of the present invention provide an improved radiation-sensitive composition. The composition may be used, for example, in a bilayer photoresist for easily manufacturing consistent products and with no concern for outgassing.

BRIEF DESCRIPTION OF THE DRAWINGS

The foregoing and other objects, aspects and advantages will be better understood from the following detailed description of the embodiments of the invention with reference to the drawings, in which:

FIG. 2 is a flow chart illustrating a method 200 of fabricating a device according to the exemplary aspects of the present invention.

DETAILED DESCRIPTION OF THE EXEMPLARY EMBODIMENTS OF THE INVENTION

Figure 1A:
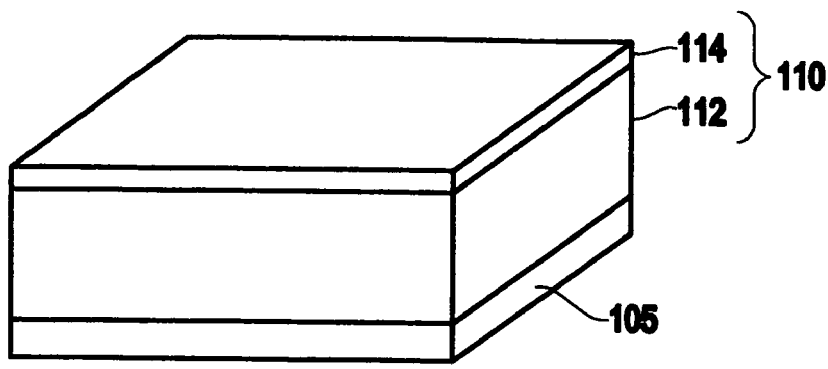
FIG. 1A-1C illustrate a method 100 of fabricating a device using a composition according to the exemplary aspects of the present invention.

Referring now to the drawings, FIGS. 1A-3 illustrate the exemplary aspects of the present invention, including a method of fabricating a device which may utilize a radiation-sensitive composition in accordance with the exemplary aspects of the present invention.

Figure 1B:
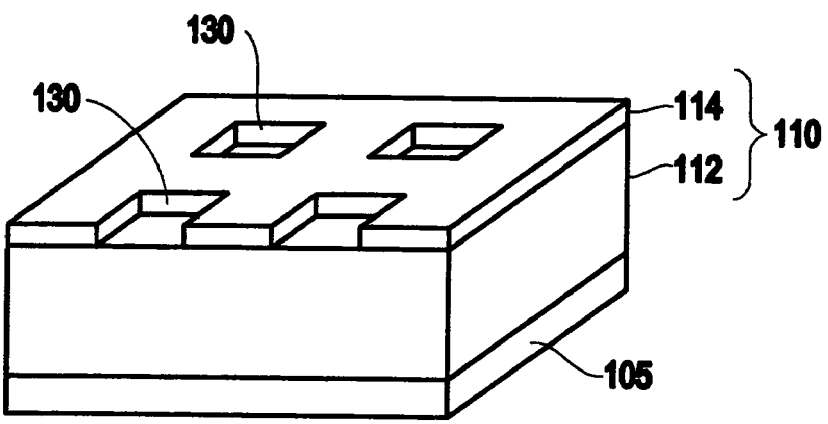
Figure 1C:
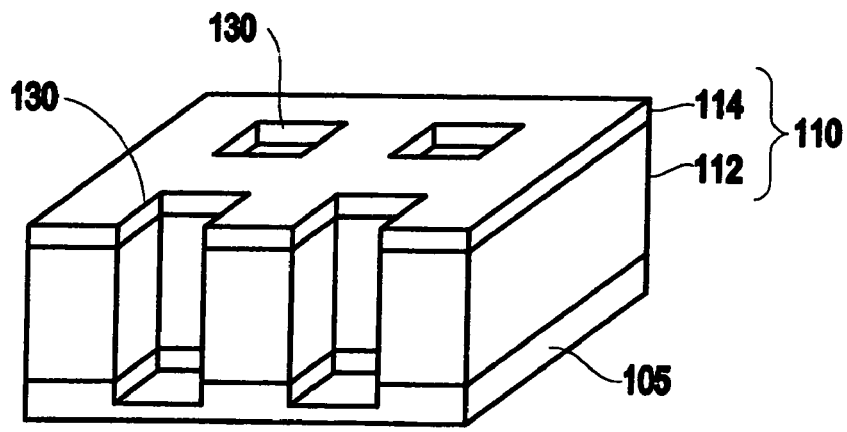

FIGS. 1A-1C illustrate a method 100 of fabricating a device utilizing a radiation-sensitive composition. As illustrated in FIG. 1A, in the method 100, a bilayer resist 110 is formed on a substrate 105 (e.g., any material which may be patterned). The bilayer resist 110 includes an underlayer 112 (e.g., organic underlayer) and an imaging layer 114 (e.g., thin film imaging layer).

As illustrated in FIG. 1B, the resist 110 is patterned by imagewise exposure and development of the imaging layer 114 layer (e.g., forming pattern spaces 130 in the imaging layer 114). Further, as illustrated in FIG. 1C, the developed pattern (e.g., pattern spaces 130) in the imaging layer 114 is transferred (e.g., using an anisotropic etch) through the underlayer 112 to the substrate 105.

An exemplary aspect of the present invention includes a radiation-sensitive composition (e.g., a positive tone resist composition) which includes a nonpolymeric silsesquioxane including at least one acid labile moiety, a polymer including at least one member selected from the group consisting of an aqueous base soluble moiety and an acid labile moiety, and a radiation-sensitive acid generator.

Another exemplary aspect of the present invention includes a radiation-sensitive composition (e.g., a negative tone resist composition) including a nonpolymeric silsesquioxane including at least one aqueous base soluble moiety, a polymer including an aqueous base soluble moiety, a crosslinker, and a radiation-sensitive acid generator.

Referring again to FIGS. 1A-1C, the radiation-sensitive composition (e.g., positive tone resist composition or negative tone resist composition) according to the exemplary aspects of the present invention may be utilized, for example, in the imaging layer 114 in the method 100 of fabricating a device.

Briefly, in the radiation-sensitive compositions according to the exemplary aspects of the present invention, the nonpolymeric silsesquioxane may include, for example, a polyhedral silsesquioxane optionally having one to three open vertices, or a macromer of two to four polyhedral silsesquioxanes that may be the same or different, with each polyhedral silsesquioxane optionally having one to three open vertices. The polyhedral silsesquioxane may include for example, from 4 to 10 faces.

Further, the acid labile moiety (e.g., in the nonpolymeric silsesquioxane and the polymer) may be selected from the group consisting of ethers, acetals, ketals, ortho esters, carboxylic esters, carbonates, sulfonates. Further, the aqueous base soluble moiety may include, for example, a hydroxyl group, a fluoroalcohol group, a carboxylic acid group, an amino group, and an imino group.

Further, the polymer may include, for example, polyphenols, polyacrylates, polymethacrylates, polycyclicolefins, cyclicolefine-maleic anhydride copolymers and the mixtures thereof. The radiation-sensitive acid generator may include, for example, nitrobenzyl compounds, sulfonium salts, iodonium salts, sulfonates, carboxlates.

The present invention also includes methods of fabricating a device which utilize the radiation-sensitive compositions according to the exemplary aspects of the present invention.

For example, FIG. 2 is a flowchart illustrating a method (200) of fabricating a device according to the exemplary aspects of the present invention. The method 200 includes applying (210) a radiation-sensitive composition to a substrate to form a resist layer on the substrate. The composition (e.g., a positive tone resist composition) may include a nonpolymeric silsesquioxane including at least one acid labile moiety, a polymer including at least one member selected from the group consisting of an aqueous base soluble moiety and an acid labile moiety, and a radiation-sensitive acid generator. The method 200 also includes patternwise exposing (220) the resist layer to radiation, to generate acid in exposed regions of the resist layer, removing (230) patternwise soluble portions of the resist layer to form a pattern of spaces in the resist layer, and transferring (240) the pattern of spaces to the substrate.

Figure 3:
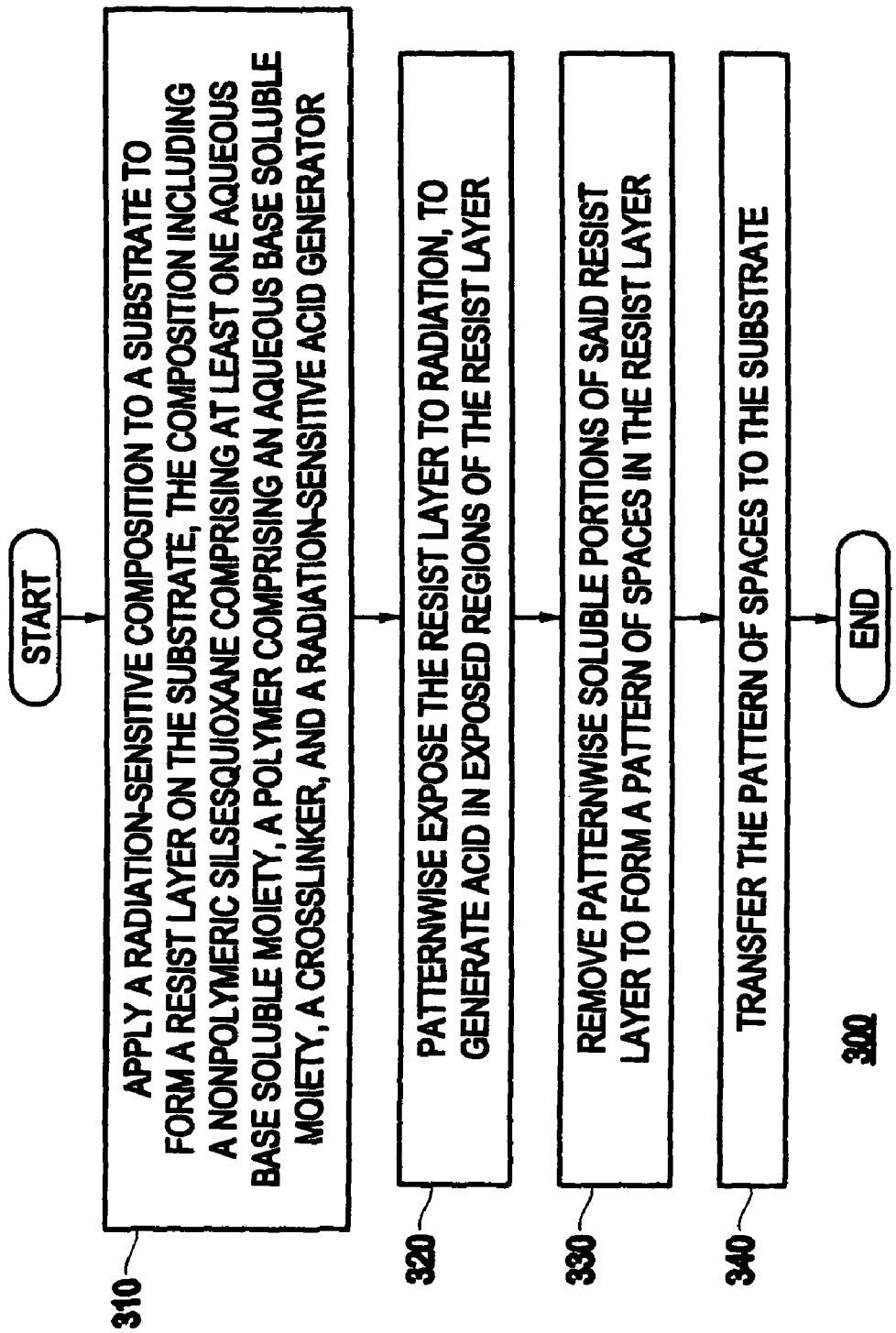
FIG. 3 is a flow chart illustrating a method 300 of fabricating a device according to the exemplary aspects of the present invention.

FIG. 3 is a flowchart illustrating a method 300 of fabricating a device according to the exemplary aspects of the present invention. The method 300 includes applying (310) a radiation-sensitive composition to a substrate to form a resist layer on the substrate. The composition (e.g., a negative tone resist composition) may include a nonpolymeric silsesquioxane including at least one aqueous base soluble moiety, a polymer including an aqueous base soluble moiety, a crosslinker, and a radiation-sensitive acid generator. The method 300 also includes patternwise exposing (320) the resist layer to radiation, to generate acid in exposed regions of the resist layer, removing (330) patternwise soluble portions of the resist layer to form a pattern of spaces in the resist layer, and transferring (340) the pattern of spaces to the substrate.

The methods 200 and 300 may further include baking the exposed resist layer to promote acid-catalyzed reaction in exposed portions of the resist layer subsequent to patternwise exposing the substrate. The methods 200 and 300 may further include forming a planarizing layer over the substrate, the resist layer being applied directly to the planarizing layer. In addition, in the methods 200 and 300, transferring the pattern may include performing an anisotropic etch to transfer the pattern to the substrate.

Nonpolymeric Silsesquioxanes

More specifically, in the radiation-sensitive composition according to the exemplary aspects of the claimed invention, the nonpolymeric silsesquioxanes may include polyhedral silsesquioxanes optionally having one to three open vertices due to missing silicon or oxygen atoms. In another aspect, the nonpolymeric silsesquioxanes may include macromers of two to four polyhedral silsesquioxanes that may be the same or different, with each polyhedral silsesquioxane optionally having one to three open vertices due to missing silicon or oxygen atoms. In such macromers, the silsesquioxane polyhedra are linked atom-to-atom rather than face-to-face. In one exemplary aspect, preferred polyhedral silsesquioxanes have about four to about ten polygonal faces.

At least one silicon atom of the nonpolymeric silsesquioxane is covalently bound to a cleavable moieity $R^{CL}$ (e.g., an acid labile moiety or an aqueous base soluble moiety). Otherwise, silicon atoms of the nonpolymeric silsesquioxane may be covalently bound to a moiety selected from: a hydrogen atom; an additional acid labile moiety (e.g., if more than one acid labile moiety is present, they may be the same or different); an additional aqueous base soluble moiety (e.g., if more than one aqueous base soluble moiety is present, they may be the same or different); an inert (e.g., acid-inert or base inert), polar substituent $R^P$; and an inert (e.g., acid-inert or base inert), nonpolar substituent $R^{NP}$ (e.g., if more than one inert, polar substituent $R^P$ is present, and/or if more than one inert, nonpolar substituent $R^{NP}$ is present, the various $R^P$ and/or $R^{NP}$ moieties may be the same or different).

A representative polyhedral silsesquioxane has the structure (PH-SSQ-1)

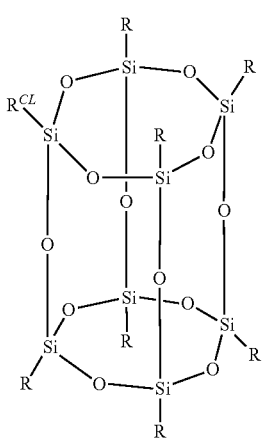

(PH-SSQ-1)

wherein the various R groups shown are H, $R^P$, $R^{NP}$, or a combination thereof.

A representative polyhedral silsesquioxane with open verticles has the structure (PH-SSQ-2):

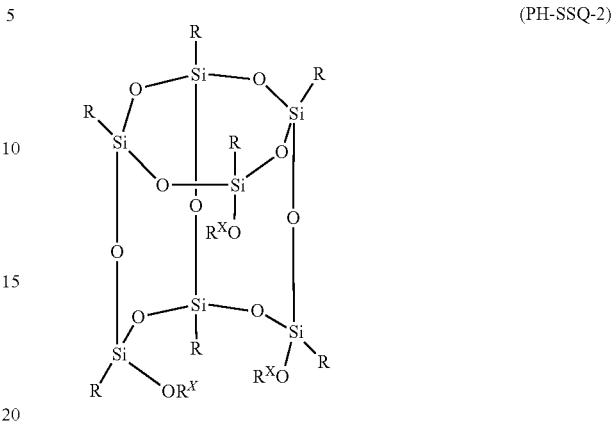

(PH-SSQ-2)

wherein R and $R^X$ may be H, a cleavable group $R^{CL}$, an inert polar substituent $R^P$, and/or an inert nonpolar substituent $R^{NP}$, providing that at least one substituent is a cleavable group.

The cleavable substituent $R^{CL}$ may have the structure of formula (I):

$$-(L^1)_m-(X)_n-[(L^2)_q-R^1]_r \qquad (I)$$

in which m, n, and q are independently zero or 1, r is an integer of at least 1 indicating the number of $-(L^2)_q-R^1$ present, and $L^1$, X, $L^2$, and $R^1$ are as follows:

$L^1$ is selected from —O—SiR$^2$R$^3$—, $C_1$-$C_{12}$ alkylene, substituted $C_1$-$C_{12}$ alkylene (e.g., $C_1$-$C_{12}$ fluoroalkylene or hydroxyl-substituted $C_1$-$C_{12}$ alkylene), $C_1$-$C_{12}$ heteroalkylene (e.g., $C_1$-$C_6$ alkoxy-substituted $C_1$-$C_6$-alkylene), substituted $C_1$-$C_{12}$ heteroalkylene (e.g., $C_1$-$C_6$ alkoxy- or hydroxyl-substituted $C_1$-$C_6$ fluoroalkylene), $C_5$-$C_{14}$ arylene, substituted $C_5$-$C_{14}$ arylene (e.g., $C_5$-$C_{14}$ fluoroarylene or hydroxyl-substituted $C_5$-$C_{14}$ arylene), $C_5$-$C_{14}$ heteroarylene (e.g., pyridinyl, pyrimidinyl, furanyl), substituted $C_5$-$C_{14}$ heteroarylene, $C_6$-$C_{14}$ aralkylene, substituted $C_6$-$C_{14}$ aralkylene, $C_6$-$C_{14}$ heteroaralkylene, and substituted $C_6$-$C_{14}$ heteroarlkylene, wherein $R^2$ and $R^3$ are hydrogen or $C_1$-$C_{12}$ hydrocarbyl, wherein when $L^1$ is optionally substituted and/or heteroatom-containing $C_3$-$C_{12}$ alkylene, $L^1$ may be linear, branched, or cyclic;

X is selected from $C_3$-$C_{30}$ alicyclic and substituted $C_3$-$C_{30}$ alicyclic;

$L^2$ is selected from $C_1$-$C_{12}$ alkylene, substituted $C_1$-$C_{12}$ alkylene, $C_1$-$C_{12}$ heteroalkylene, substituted $C_1$-$C_{12}$ heteroalkylene, $C_5$-$C_{14}$ arylene, substituted $C_5$-$C_{14}$ arylene, $C_5$-$C_{14}$ heteroarylene, substituted $C_5$-$C_{14}$ heteroarylene, $C_6$-$C_{14}$ aralkylene, substituted $C_6$-$C_{14}$ aralkylene, $C_6$-$C_{14}$ heteroaralkylene, and substituted $C_6$-$C_{14}$ heteroaralkylene, wherein when $L^2$ is optionally substituted and/or heteroatom-containing $C_3$-$C_{12}$ alkylene, $L^2$ may be linear, branched, or cyclic; and $R^1$ is selected from acid-cleavable ester, oligomeric ester, ether, carbonate, acetal, ketal, and orthoester substituents.

In one exemplary aspect, the substituents of the cleavable group $R^{CL}$ may be as follows:

$L^1$ is —O—SiR$^2$R$^3$— or $C_1$-$C_{12}$ alkylene, wherein $R^2$ and $R^3$ are as defined above. Preferably, $L^1$ is selected from $C_1$-$C_6$ alkylene and —O—SiR$^2$R$^3$— in which $R^2$ and $R^3$ are $C_1$-$C_6$ alkyl. Such linkages include, by way of example, —O—SiH(CH$_3$)—, —O—Si(CH$_3$)$_2$—, —O—SiH(CH$_2$CH$_3$)—, —O—SiH($C_6H_6$)—, —$CH_2$—, —($CH_2$)$_2$—, —($CH_2$)$_3$—, —($CH_2$)$_4$—($CH_2$)$_5$—, —($CH_2$)$_6$—, —$CH_2$—CH($CH_3$)—, —($CH_2$)$_2$—CH($CH_2CH_3$), —$CH_2$—CH($CH_3$)—$CH_2$—, -Cy- wherein Cy is cyclohexyl, —$CH_2$-Cy-$CH_2$—, etc.

X is $C_3$-$C_{18}$ alicyclic, e.g., norbornanyl (NB), adamantanyl (AD), —NB—$CH_2$—, —NB—($CH_2$)$_2$—, —NB—($CH_2$)$_4$—, -AD-$CH_2$—, -AD-($CH_2$)$_3$—, etc. Generally, X is $C_3$-$C_{12}$ alicyclic.

$L^2$ is selected from $C_1$-$C_{12}$ alkylene, hydroxyl-substituted $C_1$-$C_{12}$ alkylene, $C_1$-$C_{12}$ fluoroalkylene, and hydroxyl-substituted $C_1$-$C_{12}$ fluoroalkylene, and in a particularly preferred embodiment is of the formula —$CR^{15}R^{16}$— wherein $R^{15}$ is hydrogen, $C_1$-$C_{12}$ alkyl, or $C_1$-$C_{12}$ fluoroalkyl, and $R^{16}$ is $C_1$-$C_{12}$ alkyl or $C_1$-$C_{12}$ fluoroalkyl.

$R^1$ is selected from —(CO)—O—$R^4$, -[$Q^1$-(CO)—O—]$_h$—$R^5$, —O—$R^6$, and —O—(CO)—O—$R^7$ in which $R^4$, $R^5$, $R^6$, and $R^7$ are substituents that render $R^1$ cleavable from $R^{CL}$, and r is 1 or 2. The linkage $Q^1$ is $C_1$-$C_{12}$ alkylene or $C_1$-$C_{12}$ fluoroalkylene, and h is an integer in the range of 2 to 8 inclusive.

$R^4$ and $R^6$ are selected from (a) hydrocarbyl substituents with a tertiary carbon attachment point, (b) substituents having the structure —$CR^8R^9$—O—$CR^{10}R^{11}R^{12}$, and (c) substituents having the structure —$CR^{13}(OR^{14})_2$, wherein $R^5$, $R^7$, and $R^{14}$ are $C_4$-$C_{12}$ hydrocarbyl, substituted $C_4$-$C_{12}$ hydrocarbyl, heteroatom-containing $C_4$-$C_{12}$ hydrocarbyl, or substituted heteroatom-containing $C_4$-$C_{12}$ hydrocarbyl, and $R^8$, $R^9$, $R^{10}$, $R^{11}$, $R^{12}$, and $R^{13}$ are independently selected from hydrogen, $C_4$-$C_{12}$ hydrocarbyl, substituted $C_4$-$C_{12}$ hydrocarbyl, heteroatom-containing $C_4$-$C_{12}$ hydrocarbyl, and substituted heteroatom-containing $C_4$-$C_{12}$ hydrocarbyl, and further wherein any two of $R^8$, $R^9$, $R^{10}$, $R^{11}$, and $R^{12}$ may be linked to form a three- to eight-membered cyclic group.

It will be appreciated that when $R^4$ and $R^6$ have the structure —$CR^8R^9$—O—$CR^{10}R^{11}R^{12}$, then $R^1$ is an acetal or a ketal, since $R^1$ in this case is either —(CO)—O—$CR^8R^9$—O—$CR^{10}R^{11}R^{12}$ or —O—$CR^8R^9$—O—$CR^{10}R^{11}R^{12}$. Analogously, when $R^4$ and $R^6$ have the structure —$CR^{13}(OR^{14})_2$, then $R^1$ is an ortho ester substituent having the structure —(CO)—O—$CR^{13}(OR^{14})_2$ or —O—$CR^{13}(OR^{14})_2$. Examples of these $R^4$ and $R^6$ substituents include tetrahydropyranyl (THP), tetrahydrofuranyl (THF), 1-ethoxyethyl, 1-methoxy-cyclohexyl, and 1-methoxypropyl. When $R^4$ and $R^6$ are hydrocarbyl substituents having a tertiary carbon attachment point, these substituents may be either cyclic (including alicyclic) or acyclic. Such substituents include, without limitation, t-butyl, adamantyl, norbornyl, isobornyl, 2-methyl-2-adamantyl, 2-methyl-2-isobornyl, 2-methyl-2-tetracyclododecenyl, 2-methyl-2-dihydrodicyclo-pentadienyl-cyclohexyl, 1-methylcyclohexyl, and 1-methylcyclopentyl.

In addition, in one exemplary aspect, $R^1$ is of the formula —(CO)—O—$R^4$, such that $R^{CL}$ has the structure

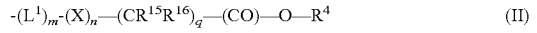

when r is 1, or is of the formula —O—$R^6$, such that $R^{CL}$ has the structure

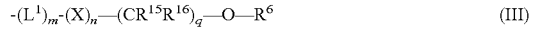

when r is 1.

For example, in the cleavable substituent, $R^4$ and $R^6$ may include hydrocarbyl substituents with a tertiary carbon attachment point. Although not limited thereto, the polar substituent $R^P$ may have the structure according to formula (IV):

in which:

m1, n1, and q1 are independently zero or 1;

$L^3$ is defined as for $L^1$, i.e., $L^3$ is selected from —O—$SiR^{19}R^{20}$—, $C_1$-$C_{12}$ alkylene, substituted $C_1$-$C_{12}$ alkylene, $C_1$-$C_{12}$ heteroalkylene, substituted $C_1$-$C_{12}$ heteroalkylene, $C_5$-$C_{14}$ arylene, substituted $C_5$-$C_{14}$ arylene, $C_5$-$C_{14}$ heteroarylene, substituted $C_5$-$C_{14}$ heteroarylene, $C_6$-$C_{14}$ aralkylene, substituted $C_6$-$C_{14}$ aralkylene, $C_6$-$C_{14}$ heteroaralkylene, and substituted $C_6$-$C_{14}$ heteroaralkylene, wherein $R^{19}$ and $R^{20}$ are hydrogen or $C_1$-$C_{12}$ hydrocarbyl, and further wherein when $L^3$ is optionally substituted and/or heteroatom-containing $C_3$-$C_{12}$ alkylene, $L^1$ may be linear, branched, or cyclic;

Y is defined as for X, i.e., Y is selected from $C_3$-$C_{30}$ alicyclic and substituted $C_3$-$C_{30}$ alicyclic;

$L^4$ is defined as for $L^2$, i.e., $L^4$ is selected from $C_1$-$C_{12}$ alkylene, substituted $C_1$-$C_{12}$ alkylene, $C_1$-$C_{12}$ heteroalkylene, substituted $C_1$-$C_{12}$ heteroalkylene, $C_5$-$C_{14}$ arylene, substituted $C_5$-$C_{14}$ arylene, $C_5$-$C_{14}$ heteroarylene, substituted $C_5$-$C_{14}$ heteroarylene, $C_6$-$C_{14}$ aralkylene, substituted $C_6$-$C_{14}$ aralkylene, $C_6$-$C_{14}$ heteroaralkylene, and substituted $C_6$-$C_{14}$ heteroaralkylene, and further wherein when $L^4$ is optionally substituted and/or heteroatom-containing $C_3$-$C_{12}$ alkylene, $L^4$ may be linear, branched, or cyclic; and $R^{18}$ is an acid-inert, polar organic group containing a heteroatom with a Pauling electronegativity greater than about 3.00.

Preferred such acid-inert, polar substituents $R^P$ are those wherein:

$L^3$ is selected from —O—$SiR^{19}R^{20}$— and $C_1$-$C_{12}$ alkylene;

Y is $C_3$-$C_{18}$ alicyclic; and $L^4$ is selected from $C_1$-$C_{12}$ alkylene, hydroxyl-substituted $C_1$-$C_{12}$ alkylene, $C_1$-$C_{12}$ fluoroalkylene, and hydroxyl-substituted $C_1$-$C_{12}$ fluoroalkylene.

In particularly preferred $R^P$ substituents:

$L^3$ is selected from —O—$SiR^{19}R^{20}$— and $C_1$-$C_6$ alkylene;

Y is $C_6$-$C_{12}$ alicyclic; and $L^4$ is of the formula —$CR^{21}CR^{22}$— wherein $R^{21}$ is hydrogen, $C_1$-$C_{12}$ alkyl, or $C_1$-$C_{12}$ fluoroalkyl, and $R^{22}$ is $C_1$-$C_{12}$ alkyl or $C_1$-$C_{12}$ fluoroalkyl, such that $R^P$ has the structure

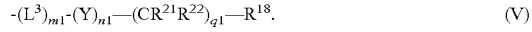

where m1, n1, q1 and $R^{18}$ are as defined above.

Preferably, the heteroatom of $R^{18}$ is O or N. Although not limited thereto, exemplary $R^{18}$ groups include hydroxyl, carboxyl, $C_1$-$C_{12}$ alkoxy, $C_1$-$C_{12}$ fluoroalkoxy, hydroxyl-substituted $C_1$-$C_{12}$ alkoxy, hydroxyl-substituted $C_1$-$C_{12}$ fluoroalkoxy, $C_2$-$C_{12}$ alkoxyalkyl, fluorinated $C_2$-$C_{12}$ alkoxyalkyl, hydroxyl-substituted $C_2$-$C_{12}$ alkoxyalkyl, fluorinated hydroxyl-substituted $C_2$-$C_{12}$ alkoxyalkyl, hydroxyl-substituted $C_1$-$C_{12}$ alkyl, hydroxyl-substituted $C_1$-$C_{12}$ fluoroalkyl, carboxyl-substituted $C_1$-$C_{12}$ alkyl, carboxyl-substituted $C_1$-$C_{12}$ fluoroalkyl, $C_2$-$C_{12}$ acyl, fluorinated $C_2$-$C_{12}$ acyl, hydroxyl-substituted $C_2$-$C_{12}$ acyl, fluorinated hydroxyl-substituted $C_2$-$C_{12}$ acyl, $C_2$-$C_{12}$ acyloxy, fluorinated $C_2$-$C_{12}$ acyloxy, hydroxyl-substituted $C_2$-$C_{12}$ acyloxy, fluorinated hydroxyl-substituted $C_2$-$C_{12}$ acyloxy, amino, mono- and di-($C_1$-$C_{12}$ alkyl)-substituted amino, amido, mono- and di-($C_2$-$C_{12}$ alkyl)amido, sulfonamido, N-heteroalicyclic, oxo-substituted N-heterocyclic, and, where the substituents permit, combinations of two or more of the foregoing.

In one exemplary aspect, $R^{18}$ is hydroxyl. It is also preferred that n1 is 1 and/or q1 is zero.

In another exemplary aspect, the silsesquioxane may include at least one acid-inert, non-polar substituent $R^{NP}$. Exemplary such groups, without limitation, may be selected from $C_1$-$C_{18}$ hydrocarbyl and substituted $C_1$-$C_{18}$ hydrocarbyl, e.g., fluorinated $C_1$-$C_{18}$ hydrocarbyl. Acid-inert $R^{NP}$ moieties include, by way of example, $C_1$-$C_{18}$ alkyl, $C_1$-$C_{18}$ hydroxyalkyl, fluorinated $C_1$-$C_{18}$ alkyl, and fluorinated $C_1$-$C_{18}$ hydroxyalkyl. Examples of fluorinated hydroxyalkyl groups include, without limitation, fluorinated lower alkanol groups having the structure -(L)$_x$-CQ$^1$Q$^2$-OH, wherein x is zero or 1, L is a linker (e.g., L$^1$ or L$^2$ as defined earlier herein), Q$^1$ is F or CF$_3$, and Q$^2$ is H, F, or CF$_3$.

Radiation-Sensitive Compositions

The composition may include, for example, a nonpolymeric silsesquioxane, as described in detail above, a polymer and a radiation-sensitive acid generator (e.g., photoacid generators (PAGs)). The silsesquioxane may represent approximately 8 wt % to 94 wt. %, and more preferably approximately 15 wt % to 60 wt %, of the solids included in the composition.

Further, the polymer may represent approximately 5 wt % to 91 wt % and, more preferably approximately 40 wt % to 85 wt % of the solids contained in the composition, and the acid generator representing approximately 0.1 wt % to 25 wt. % of the solids contained in the composition. Other components and additives may also be present (e.g., crosslinking agents (e.g., for negative tone resists), dissolution modifying additives such as dissolution inhibitors, etc.).

It should be noted that the composition may be formed by adding silsesquioxane to an existing and workable resist composition. That is, the inventors determined that the characteristics of an existing resist (e.g., positive tone or negative tone) composition (e.g., a resist composition that includes a polymer having one of an aqueous base soluble moiety and an acid labile moiety) may be improved by adding silsesquioxane to the existing resist. The inventors determined, for example, that an imaging layer including the resulting composition, provided a bilayer photoresist for easily manufacturing consistent products and with no concern for outgassing The acid generator may include any compound that, upon exposure to radiation, generates an acid (e.g., strong acid) and is compatible with the other components of the composition. Examples of acid generators include, but are not limited to, sulfonates, onium salts, aromatic diazonium salts, sulfonium salts, diaryliodonium salts and sulfonic acid esters of N-hydroxyamides or N-hydroxyimides. The acid generator used in the claimed invention should have high thermal stability (e.g., stable to at least 140° C.) so the acid generator is not degraded during pre-exposure processing.

Any suitable acid generator can be used in the composition of the invention. Typical acid generators include, without limitation:

(1) sulfonium salts, such as triphenylsulfonium perfluoromethanesulfonate (triphenylsulfonium triflate), triphenylsulfonium perfluorobutanesulfonate, triphenylsulfonium perfluoropentanesulfonate, triphenylsulfonium perfluorooctanesulfonate, triphenylsulfonium hexafluoroantimonate, triphenylsulfonium hexafluoroarsenate, triphenylsulfonium hexafluorophosphate, triphenylsulfonium bromide, triphenylsulfonium chloride, triphenylsulfonium iodide, 2,4,6-trimethylphenyldiphenylsulfonium perfluorobutanesulfonate, 2,4,6-trimethylphenyldiphenylsulfonium benzenesulfonate, tris(t-butylphenyl)sulfonium perfluorooctane sulfonate, diphenylethylsulfonium chloride, and phenacyldimethylsulfonium chloride;

(2) halonium salts, particularly iodonium salts, including diphenyliodonium perfluoromethanesulfonate (diphenyliodonium triflate), diphenyliodonium perfluorobutanesulfonate, diphenyliodonium perfluoropentanesulfonate, diphenyliodonium perfluorooctanesulfonate, diphenyliodonium hexafluoroantimonate, diphenyliodonium hexafluoroarsenate, diphenyliodonium bis-(t-butylphenyl)iodonium triflate, and bis-(di-t-butylphenyl)-iodonium camphanylsulfonate;

(3) α,α'-bis-sulfonyl-diazomethanes such as bis(p-toluenesulfonyl)diazomethane, methylsulfonyl p-toluenesulfonyldiazomethane, 1-cyclohexylsulfonyl-1-(1,1-dimethylethylsulfonyl)diazomethane, and bis(cyclohexylsulfonyl)diazomethane;

(4) trifluoromethanesulfonate esters of imides and hydroxyimides, e.g., α-(trifluoromethylsulfonyloxy)-bicyclo [2.2.1]hept-5-ene-2,3-dicarboximide (MDT);

(5) nitrobenzyl sulfonate esters such as 2-nitrobenzyl p-toluenesulfonate, 2,6-dinitrobenzyl p-toluenesulfonate, and 2,4-dinitrobenzyl p-trifluoromethylbenzene sulfonate;

(6) sulfonyloxynaphthalimides such as N-camphorsulfonyloxynaphthalimide and N-pentafluorophenylsulfonyloxynaphthalimide;

(7) pyrogallol derivatives (e.g., trimesylate of pyrogallol);

(8) naphthoquinone-4-diazides;

(9) alkyl disulfones;

(10) s-triazine derivatives, as described in U.S. Pat. No. 4,189,323; and

(11) miscellaneous sulfonic acid generators including t-butylphenyl-α-(p-toluenesulfonyloxy)-acetate, t-butyl-α-(p-toluenesulfonyloxy)acetate, and N-hydroxy-naphthalimide dodecane sulfonate (DDSN), and benzoin tosylate.

A dissolution modifying additive, generally although not necessarily a dissolution inhibitor, may be included. If a dissolution inhibitor is present, it will typically represent in the range of about 1 wt. % to 40 wt. %, preferably about 5 wt. % to 30 wt. %, of the total solids. Preferred dissolution inhibitors have high solubility in the radiation-sensitive composition and in the solvent used to prepare solutions of the radiation-sensitive composition (e.g., propylene glycol methyl ether acetate, or "PGMEA"), exhibit strong dissolution inhibition, have a high exposed dissolution rate, are substantially transparent at the wavelength of interest, may exhibit a moderating influence on $T_g$, strong etch resistance, and display good thermal stability (i.e., stability at temperatures of about 140° C. or greater).

Suitable dissolution inhibitors include, but are not limited to, bisphenol A derivatives, e.g., wherein one or both hydroxyl moieties are converted to a t-butoxy substituent or a derivative thereof such as a t-butoxycarbonyl or t-butoxycarbonylmethyl group; fluorinated bisphenol A derivatives such as CF$_3$-bisphenol A-OCH$_2$(CO)—O-tBu (6F-bisphenol A protected with a t-butoxycarbonylmethyl group); normal or branched chain acetal groups such as 1-ethoxyethyl, 1-propoxyethyl, 1-n-butoxyethyl, 1-isobutoxy-ethyl, 1-t-butyloxyethyl, and 1-t-amyloxyethyl groups; and cyclic acetal groups such as tetrahydrofuranyl, tetrahydropyranyl, and 2-methoxytetrahydro-pyranyl groups; androstane-17-alkylcarboxylates and analogs thereof, wherein the 17-alkylcarboxylate at the 17-position is typically lower alkyl. Examples of such compounds include lower alkyl esters of cholic, ursocholic and lithocholic acid, including methyl cholate, methyl lithocholate, methyl ursocholate, t-butyl cholate, t-butyl lithocholate, t-butyl ursocholate, and the like (see, e.g., Allen et al. (1995) *J. Photopolym Sci. Technol.*, cited supra); hydroxyl-substituted analogs of such compounds (ibid.); and androstane-17-alkylcarboxylates substituted with one to three 3 $C_1$-$C_4$ fluoroalkyl carbonyloxy substituents, such as t-butyl trifluoroacetyllithocholate (see, e.g., U.S. Pat. No. 5,580,694 to Allen et al.).

The radiation-sensitive composition (e.g., the remainder of the composition) may include a solvent and may additionally include customary additives such as dyes, sensitizers, additives used as stabilizers and acid-diffusion controlling agents, coating aids such as surfactants or anti-foaming agents, adhesion promoters and plasticizers.

The choice of solvent may be governed by factors not limited to the solubility and miscibility of composition components, the coating process, and safety and environmental regulations. Additionally, inertness to other composition components is desirable. It is also desirable that the solvent possess the appropriate volatility to allow uniform coating of films yet also allow significant reduction or complete removal of residual solvent during the post-application bake process.

In addition to the above components, the radiation-sensitive compositions provided herein may include a casting solvent to dissolve the other components so that the overall composition may be applied evenly (e.g., on a substrate surface) to provide a substantially defect-free coating. Where the composition is used in a multilayer (e.g., bilayer) imaging process, the solvent used in the imaging layer photoresist is preferably not a solvent to the underlayer materials (e.g., organic underlayer), otherwise the unwanted intermixing may occur. When the underlayer composition uses a crosslinker approach, a cross-linked underlayer will prevent intermixing. In this case, the same or a different solvent can be used for both the imaging layer and the underlayer.

The invention is not limited to selection of any particular solvent. Suitable casting solvents may generally be chosen from ether-, ester-, hydroxyl-, and ketone-containing compounds, or mixtures of these compounds. Examples of appropriate solvents include carbon dioxide, cyclopentanone, cyclohexanone, ethyl 3-ethoxypropionate (EEP), a combination of EEP and γ-butyrolactone (GBL), lactate esters such as ethyl lactate, alkylene glycol alkyl ether esters such as PGMEA, alkylene glycol monoalkyl esters such as methyl cellosolve, butyl acetate, and 2-ethoxyethanol.

In one aspect, preferred solvents include ethyl lactate, propylene glycol methyl ether acetate, ethyl 3-ethoxypropionate and their mixtures. The above list of solvents is for illustrative purposes only and should not be viewed as being comprehensive nor should the choice of solvent be viewed as limiting the invention in any way. Greater than 50 percent of the total mass of the resist formulation may be composed of the solvent, preferably greater than 80 percent.

Other customary additives include dyes that may be used to adjust the optical density of the radiation-sensitive composition and sensitizers which enhance the activity of acid generators by absorbing radiation and transferring it to the acid generator. Examples include aromatics such as functionalized benzenes, pyridines, pyrimidines, biphenylenes, indenes, naphthalenes, anthracenes, coumarins, anthraquinones, other aromatic ketones, and derivatives and analogs of any of the foregoing.

A wide variety of compounds with varying basicity may be used as stabilizers and acid-diffusion controlling additives. Such compounds may include nitrogenous compounds such as aliphatic primary, secondary, and tertiary amines, cyclic amines such as piperidines, pyrimidines, morpholines, aromatic heterocycles such as pyridines, pyrimidines, purines, imines such as diazabicycloundecene, guanidines, imides, amides, and others. Ammonium salts may also be used, including ammonium, primary, secondary, tertiary, and quaternary alkyl- and arylammonium salts of alkoxides including hydroxide, phenolates, carboxylates, aryl and alkyl sulfonates, sulfonamides, and others. Other cationic nitrogenous compounds including pyridinium salts and salts of other heterocyclic nitrogenous compounds with anions such as alkoxides including hydroxide, phenolates, carboxylates, aryl and alkyl sulfonates, sulfonamides, and the like may also be employed.

Surfactants may be used to improve coating uniformity, and include a wide variety of ionic and non-ionic, monomeric, oligomeric, and polymeric species. Likewise, a wide variety of anti-foaming agents may be employed to suppress coating defects. Adhesion promoters may be used as well; again, a wide variety of compounds may be employed to serve this function. A wide variety of monomeric, oligomeric, and polymeric plasticizers such as oligo- and polyethyleneglycol ethers, cycloaliphatic esters, and non-acid reactive steroidally derived materials may be used as plasticizers, if desired. However, neither the classes of compounds nor the specific compounds mentioned above are intended to be comprehensive and/or limiting. One versed in the art will recognize the wide spectrum of commercially available products that may be used to carry out the types of functions that these customary additives perform.

In one aspect, the sum of all customary additives may amount to less than 20 percent of the solids included in the composition, preferably, less than 5 percent.

Further, as noted above, the composition includes a polymer. The polymer may include, for example, polyphenols, polyacrylates, polymethacrylates, polycyclicolefins, cyclicolefine-maleic anhydride copolymers and the mixtures thereof. Polyphenols include novolac resins, and hydroxystyrene polymers. Novolac resins are polymers obtained through condensation polymerization of cresol and formaldehyde. Typical photoresists used in 436 and 365 nm optical exposure system contain novolac resins. Hydroxystyrene polymers synthesized through cationic, anionic or radical polymerization. Typical photoresists used in 248 nm contain hydroxystyrene polymers. Examples of such polymers are disclosed in U.S. Pat. Nos. 4,491,628, 4,883,740, 5,075,199, 5,861,231, 6,037,097, 6,042,997, 6,077,643, and 6,227,546.

The polyacrylates, polymethacrylates, polycyclicolefins, cyclicolefine-maleic anhydride copolymers are formed by addition polymerization or free radical polymerization, and are used in 193 nm optical lithography. The examples of these polymers are disclosed in U.S. Pat. Nos. 5,468,819, 5,705,503, 5,843,624, 6,048,664, 6,124,074, 6,177,228, 6,534,239, and 6,635,401.

It should be noted that the resist composition and method which were disclosed in above-referenced U.S. patent application Ser. No. 10/721,302, which was filed on Nov. 24, 2003, describes a photoresist composition which may include a polymer such as a silicon-containing polymer or a fluorinated polymer. The radiation-sensitive composition of the present invention, on the other hand, may include a polymer which does not necessarily include silicon or fluorine. For example, the polymer utilized in the present invention may include polymers such as polyphenols, polyacrylates, polymethacrylates, polycyclicolefins, cyclicolefine-maleic anhydride copolymers and the mixtures thereof.

In addition, it should be noted that in U.S. patent application Ser. No. 10/721,302, the composition includes primarily a nonpolymeric silsesquioxane and an acid generator. That is, in that application, a polymer may be added to the composition to provide or increase transparency at a predetermined, desired wavelength, increase dry etch resistance, and/or improve aqueous base development.

An object of the inventors of the present invention, however, was to provide a composition resulting from the addition of a nonpolymeric silsesquioxane with an existing resist composition. That is, an object of the inventors was to develop a method (and a composition resulting therefrom) of improving the characteristics of an existing resist composition (e.g., a resist composition that includes a polymer having one of an aqueous base soluble moiety and an acid labile moiety).

Thus, the invention may include a process for manufacturing a radiation-sensitive composition, which includes providing a composition including a polymer having at least one member selected from the group consisting of an aqueous base soluble moiety and an acid labile moiety, and a radiation-sensitive acid generator, and adding a nonpolymeric silsesquioxane to the composition, the nonpolymeric silsesquioxane including at least one acid labile moiety.

Fabricating a Device Using the Composition

The present invention also includes a method of fabricating a device using a radiation-sensitive composition.

For example, referring again to FIGS. 1A-1C, in the exemplary-aspects of the present invention, an underlayer (e.g., organic underlayer) may be formed on a substrate. Suitable substrates include ceramic, metallic or semiconductive, silicon-containing (for example, silicon dioxide, silicon nitride, and silicon oxynitride). The substrate may or may not be coated with an organic anti-reflective layer prior to deposition of the organic underlayer.

The planarizing underlayer should be sufficiently etchable, selective to the overlying photoresist (to yield a good profile in the etched underlayer) while being resistant to the etch process needed to pattern the underlying material layer. Additionally, the planarizing underlayer composition should have the desired optical characteristics (e.g., refractive index, optical density, etc.) such that the need for any additional antireflective coating (ARC) layer is avoided. The planarizing underlayer composition should also have physical/chemical compatibility with the imaging resist layer to avoid unwanted interactions which may cause footing and/or scumming. The underlayer may include, for example, hard-baked diazonaphthoquinone (DNQ)/novolak compositions, polyimides, polyesters, polyacrylates, or the like. In one aspect, DNQ novolac is a preferred underlayer for 248 nm lithography. In the other aspect, the planarizing underlayer compositions for 193 nm lithography are preferrably characterized by the presence of (A) a polymer containing: (i) cyclic ether moieties, (ii) saturated polycyclic moieties, and (iii) aromatic moieties for compositions not requiring a separate crosslinker, or (B) a polymer containing: (i) saturated polycyclic moieties, and (ii) aromatic moieties for compositions requiring a separate crosslinker, as described in U.S. Published patent application No. US 2002/0058204 A1, published May 16, 2002.

The imaging layer may be formed on the underlayer. For example, the underlayer may be coated with the above-described radiation sensitive composition dissolved in a suitable solvent.

In one exemplary aspect, the surface of the substrate is cleaned by standard procedures before the film is deposited thereon. Suitable solvents for the composition are as described in the preceding section, and include, for example, cyclohexanone, ethyl lactate, and propylene glycol methyl ether acetate. The film can be coated on the substrate using art-known techniques such as spin or spray coating, or doctor blading.

Before the film has been exposed to radiation, the film may be heated to a temperature of about 90-150° C., typically about 80-120° C., for a short period of time, typically on the order of about 1 minute. The dried film may have a thickness of about 0.02 to 5.0 microns, preferably about 0.05 to 2.5 microns, and most preferably about 0.10 to 1.0 microns.

The radiation to which the composition (e.g., resist layer) may be exposed may include, for example, ultraviolet, electron beam or x-ray. The radiation-sensitive composition may be used, for example, with DUV wavelengths of 157 nm, 193 nm, or 248 nm, or with EUV (e.g., at 13 nm), electron beam or x-ray radiation. In one exemplary aspect, ultraviolet radiation is preferred, particularly deep ultraviolet radiation having a wavelength of less than about 250 nm, e.g., 157 nm using an $F_2$ excimer laser.

However, it is important to note that the present invention is not limited to use with any particular type or wavelength of radiation (e.g., in a lithographic system). That is, the method and composition of the present invention (e.g., including a polymer combined with a nonpolymeric silsesquioxane) may be used, for example, in a system utilizing a wavelength of 248 nm, 193 nm, 157 nm, 90 nm, 65 nm, etc.

In one exemplary aspect (e.g., for positive tone resist), the radiation is absorbed by the radiation-sensitive acid generator to generate free acid, which with heating (e.g., baking) causes cleavage of acid-labile pendant groups and formation of the corresponding acid.

The "post-exposure bake" (PEB) process may be carried out at a temperature below the glass transition temperature $T_g$ of the radiation-sensitive composition. Generally, PEB may be carried out at a temperature at least 5° C. below $T_g$, more preferably, at a temperature at least 10° C. below $T_g$.

The image may be developed with a suitable solvent. Suitable solvents include an aqueous base, preferably an aqueous base without metal ions such as the industry standard developer tetramethylammonium hydroxide or choline. Other solvents may include organic solvents or carbon dioxide (in the liquid or supercritical state).

The pattern from the resist structure may then be transferred to the material of the substrate. The transfer may be achieved, for example, by reactive ion etching or some other etching technique. Thus, the composition provided herein and resulting imaging layer (e.g., resist structure) can be used to create patterned material layer structures such as metal wiring lines, holes for contacts or vias, insulation sections (e.g., damascene trenches or shallow trench isolation), trenches for capacitor structures, etc. as might be used in the design of integrated circuit devices.

Accordingly, the methods of fabricating these features include, after development with a suitable developer as above, etching the layer(s) underlying the resist layer at spaces in the pattern whereby a patterned material layer or substrate section is formed, and removing any remaining resist from the substrate. In some instances, a hard mask may be used below the resist layer to facilitate transfer of the pattern to a further underlying material layer or section.

In the manufacture of integrated circuits, circuit patterns can be formed in the exposed areas (for positive tone resist) after resist development by coating the substrate with a conductive material, e.g., a metallic material, using known techniques such as evaporation, sputtering, plating, chemical vapor deposition, or laser-induced deposition. Dielectric materials may also be deposited by similar means during the process of making circuits. Inorganic ions such as boron, phosphorous, or arsenic can be implanted in the substrate in the process for making p-doped or n-doped circuit transistors. It should be understood that the invention is not limited to any specific lithographic technique or device structure.

It is to be understood that while the invention has been described in conjunction with the preferred specific embodiments thereof, that the foregoing description as well as the examples that follow are intended to illustrate and not limit the scope of the invention. Other aspects, advantages and modifications within the scope of the invention will be apparent to those skilled in the art to which the invention pertains.

EXAMPLES

The following examples are intended to provide those of ordinary skill in the art with a more complete disclosure and description of how to prepare and use the compositions disclosed and claimed herein. Efforts have been made to ensure accuracy with respect to numbers (e.g., amounts, temperature, etc.), but allowance should be made for the possibility of errors and deviations. Unless indicated otherwise, parts are parts by weight, temperature is in ° C. and pressure is at or near atmospheric. It should be noted that the invention is not limited to the details of the following examples, but may include other methods and compositions.

The nonpolymeric silsesquioxanes synthesized in the following examples have the general structure (1), where R is defined in the example.

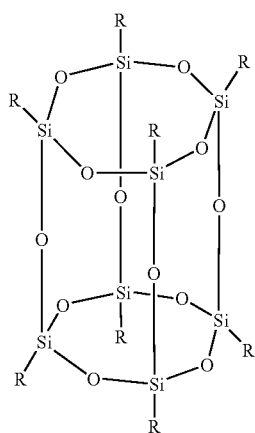

(1)

Example 1

Compound 1A, having the structure (1) wherein about 66% of the R (e.g., about 5 of the 8 Rs in general structure (1)) is

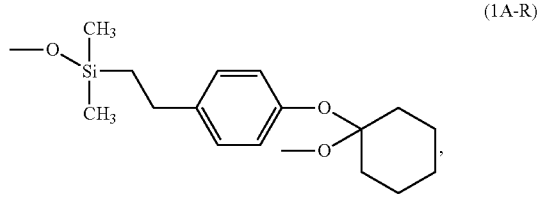

(1A-R)

was synthesized as follows:

A. Synthesis of Octa[(ethylphenol)dimethylsiloxy]silsesquioxane: 2 g of octa[(ethylphenylacetate)dimethylsiloxy]silsesquioxane was dissolved in 7.5 g of acetone. The solution was combined with 2.1 g of 3N HCl and refluxed at 60° C. for approximately 4 hours. The solid of octa[(ethylphenol)dimethylsiloxy]silsesquioxane was precipitated out of deionized water and dried in a vacuum oven at ~40° C. overnight. $C^{13}$ NMR showed that the compound was fully hydrolyzed to phenol end groups.

B. Synthesis of Compound 1A: 0.9 g of octa[(ethylphenol)dimethylsiloxy]silsesquioxane was dissolved in 10 g of PGMEA. The solution was then combined with approximately 2 mg of oxalic acid. After the acid was dissolved, 0.6 g of 1-methoxycyclohexene was added to the solution, and the reaction was carried out at room temperature with stirring overnight. NMR analysis showed only 46% protection. Another 0.6 g of 1-methoxycyclohexene was added to the reaction. After stirring for 3 days, the reaction was quenched with 2.2 g of basic active aluminum oxide. A protection level of 66% on phenol group was determined by $C^{13}$ NMR.

Example 2

Lithographic evaluation of nonpolymeric silsesquioxane containing acid labile group as an additive to a positive tone chemically amplified resist.

A. Formulation of a chemically amplified resist: A resist formulation was obtained by mixing the 25% methoxycyclohexene protected polyvinylphenol (VP5000 from Tomen) with 0.28 wt. % (relative to the polymer) tetrabutyl ammonium hydroxide (TBAH), 2.8 wt. % triphenylsulfonium triflate (TPS TRF) and 200-400 ppm of FC-430 surfactant (3M Company) in PGMEA solvent. The total solid weight content in the solution was about 14%.

B. Formulation of a resist containing additive of nonpolymeric silsesquioxane consisting of acid labile group: 2.4 g of methoxycyclohexene protected octa[(ethylphenol) dimethylsiloxy]silsesquioxane prepared in Example 1(B) was mixed with 2 g of the resist prepared in Example 2(A).

C. Lithographic evaluation: The resist formulated in (B) above was spin coated onto respective HMDS-primed wafer. The resist-coated wafer was baked on a hot plate at 110° C. for 1 minute. The resist-coated wafers were exposed using an IBM-built 25 kV Gaussian-beam system (FELS). After exposure, the resist was allowed to sit at room temperature for 30 minutes before being developed with 0.263 N TMAH for 60 s. Resolution of 100-200 nm l/s resist images were resolved at 4.5 µC/cm².

Example 3

Lithographic evaluation of nonpolymeric silsesquioxane containing no acid labile group as an additive to a positive tone chemically amplified resist. (comparable example).

A. Formulation of a chemically amplified resist: A resist formulation was obtained by mixing the 25% methoxycyclohexene protected polyvinylphenol (10% hydrogenated from Maruzen) with 0.14 wt. % (relative to the polymer) tetrabutyl ammonium hydroxide (TBAH), 0.7 wt. % triphenylsulfonium triflate (TPS TRF) and 200-400 ppm of FC-430 surfactant (3M Company) in PGMEA solvent. The total solid weight content in the solution was about 12%.

B. Formulation of a resist containing additive of nonpolymeric silsesquioxane consisting of no acid labile group: Add 0.3 g of octa[(ethylphenol)dimethylsiloxy]silsesquioxane prepared in Example 1(A) and 1.7 g of PGMEA solvent to 0.7 g of the resist prepared in Example 3(A) above.

C. Lithographic evaluation: The resist formulated in (B) above was spin coated onto respective HMDS-primed wafer. The resist-coated wafer was baked on a hot plate at 110° C. for 1 minute. The resist-coated wafers were exposed using an IBM-built 25 kV Gaussian-beam system (FELS). After exposure, the resist was baked at 110° C. for 1 minute before being developed with 0.263 N TMAH for 60 s. The resist failed to resolve 200 nm l/s images.

Example 4

Lithographic evaluation of nonpolymeric silsesquioxane as an additive to a negative tone chemically amplified resist.

A. Formulation of a negative tone chemically amplified resist: A resist formulation was obtained by mixing 6 g of hydroxystyrene-co-styrene polymer (80/20, from Tomen) with 1.68 g of 0.5% tetrabutyl ammonium hydroxide (TBAH) in PGMEA, 126 mg triphenylsulfonium triflate (TPS TRF), 480 mg of powderlink and 46.84 g of PGMEA containing 200-400 ppm of FC-430 surfactant (3M Company). The total solid weight content in the solution was about 12%.

B. Formulation of a negative tone resist containing additive of nonpolymeric silsesquioxane: Add 0.25 g of octa[(ethylphenol)dimethylsiloxy]silsesquioxane prepared in Example 1(A), 20 mg of powderlink and 1.53 g of PGMEA solvent to 6.25 g of the resist prepared in Example 4(A) above.

C. Lithographic evaluation: The resist formulated in (B) above was spin coated onto respective HMDS-primed wafer. The resist-coated wafer was baked on a hot plate at 110° C. for 1 minute. The resist-coated wafers were exposed using an IBM-built 25 kV Gaussian-beam system (FELS). After exposure, the resist was baked at 110° C. for 1 minute before being developed with 0.263 N TMAH for 60 s. Resolution of 150 and 200 nm l/s resist images were resolved at 4 and 4.5 µC/cm².

With its unique and novel features, the exemplary aspects of the present invention provide an improved radiation-sensitive composition. The composition may be used, for example, in a bilayer photoresist for easily manufacturing consistent products and with no concern for outgassing While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive assembly is not limited to that disclosed herein but may be modified within the spirit and scope of the present invention.

Further, Applicant's intent is to encompass the equivalents of all claim elements, and no amendment to any claim in the present application should be construed as a disclaimer of any interest in or right to an equivalent of any element or feature of the amended claim.

What is claimed is:

1. A radiation-sensitive composition, comprising:
   a nonpolymeric silsesquioxane comprising at least one acid labile moiety;
   a polymer comprising at least one member selected from a group consisting of an aqueous base soluble moiety and an acid labile moiety; and
   a radiation-sensitive acid generator,
   wherein said polymer is selected from a group consisting of polyacrylates, polymethacrylates, polycyclicolefins, cyclicolefine-maleic anhydride copolymers, and a mixture thereof, and
   wherein said nonpolymeric silsesquioxane is present in a range from more than 10 wt % to 94 wt % of solids in said composition.

2. The radiation-sensitive composition of claim 1, wherein said nonpolymeric silsesquioxane is selected from a group consisting of:
   a polyhedral silsesquioxane optionally having one to three open vertices; and
   a macromer of two to four polyhedral silsesquioxanes that may be the same or different, with each polyhedral silsesquioxane optionally having one to three open vertices.

3. The radiation-sensitive composition of claim 2, wherein said polyhedral silsesquioxane comprises from 4 to 10 faces.

4. The radiation-sensitive composition of claim 1, wherein said acid labile moiety in said nonpolymeric silsesquioxane and said acid labile moiety in said polymer are selected from a group consisting of ethers, acetals, ketals, ortho esters, carboxylic esters, carbonates, and sulfonates.

5. The radiation-sensitive composition of claim 1, wherein said aqueous base soluble moiety is selected from a group consisting of a hydroxyl, a fluoroalcohol, a carboxylic acid, an amino group, and an imino group.

6. The radiation-sensitive composition of claim 1, wherein said radiation-sensitive acid generator is selected from a group consisting of nitrobenzyl compounds, sulfonium salts, iodonium salts, sulfonates, and carboxlates.

7. An imaging layer for patterning a substrate, said imaging layer comprising the radiation-sensitive composition of claim 1.

8. A bilayer resist layer for patterning a substrate, comprising:
   an underlayer formed on said substrate; and
   the imaging layer of claim 7 formed on said underlayer.

9. The radiation-sensitive composition of claim 1, wherein said acid labile moiety in said nonpolymeric silsesquioxane is covalently bound to a silicon atom in said nonpolymeric silsesquioxane.

10. The radiation-sensitive composition of claim 1, wherein said acid labile moiety in said nonpolymeric silsesquioxane comprises a structure of formula (I):

wherein m, n, and q are independently zero or 1, r is an integer of at least 1 indicating the number of $(L^2)_q$-$R^1$ present, and $L^1$, X, $L^2$, and $R^1$ are as follows:

$L^1$ comprises a member selected from a group consisting of —O—$SiR^2R^3$—, $C_1$-$C_{12}$ alkylene, substituted $C_1$-$C_{12}$ alkylene (e.g., $C_1$-$C_{12}$ fluoroalkylene or hydroxyl-substituted $C_1$-$C_{12}$ alkylene), $C_1$-$C_{12}$ heteroalkylene (e.g., $C_1$-$C_6$ alkoxy-substituted $C_1$-$C_6$ alkylene), substituted $C_1$-$C_{12}$ heteroalkylene (e.g., $C_1$-$C_6$ alkoxy- or hydroxyl-substituted $C_1$-$C_6$ fluoroalkylene), $C_5$-$C_{14}$ arylene, substituted $C_5$-$C_{14}$ arylene (e.g., $C_5$-$C_{14}$ fluoroarylene or hydroxyl-substituted $C_5$-$C_{14}$ arylene), $C_5$-$C_{14}$ heteroarylene (e.g., pyridinyl, pyrimidinyl, furanyl), substituted $C_5$-$C_{14}$ heteroarylene, $C_6$-$C_{14}$ aralkylene, substituted $C_6$-$C_{14}$ aralkylene, $C_6$-$C_{14}$ heteroaralkylene, and substituted $C_6$-$C_{14}$ heteroaralkylene, wherein $R^2$ and $R^3$ are hydrogen or $C_1$-$C_{12}$ hydrocarbyl, wherein when $L^1$ is optionally substituted and/or heteroatom-containing $C_3$-$C_{12}$ alkylene, $L^1$ is linear, branched, or cyclic;

X comprises a member selected from a group consisting of $C_3$-$C_{30}$ alicyclic and substituted $C_3$-$C_{30}$ alicyclic; and $L^2$ comprises a member selected from a group consisting of $C_1$-$C_{12}$ alkylene, substituted $C_1$-$C_{12}$ alkylene, $C_1$-$C_{12}$ heteroalkylene, substituted $C_1$-$C_{12}$ heteroalkylene, $C_5$-$C_{14}$ arylene, substituted $C_5$-$C_{14}$ arylene, $C_5$-$C_{14}$ heteroarylene, substituted $C_5$-$C_{14}$ heteroarylene, $C_6$-$C_{14}$ aralkylene, substituted $C_6$-$C_{14}$ aralkylene, $C_6$-$C_{14}$ heteroaralkylene, and substituted $C_6$-$C_{14}$ heteroaralkylene, wherein when $L^2$ is optionally substituted and/or heteroatom-containing $C_3$-$C_{12}$ alkylene, $L^2$ is linear, branched, or cyclic; and $R^1$ is selected from acid-cleavable ester, oligomeric ester, ether, carbonate, acetal, ketal, and orthoester substituents.

11. The radiation-sensitive composition of claim 1, wherein said polymer is selected from a group consisting of polyacrylates, polycyclicolefins, cyclicolefine-maleic anhydride copolymers, and a mixture thereof.

12. The radiation-sensitive composition of claim 1, wherein said polymer comprises a non silsesquioxane polymer.

13. A method of fabricating a device, said method comprising:
applying a radiation-sensitive composition to a substrate to form a resist layer on said substrate, said composition comprising:
a nonpolymeric silsesquioxane comprising at least one acid labile moiety,
a polymer comprising at least one member selected from a group consisting of an aqueous base soluble moiety and an acid labile moiety; and
a radiation-sensitive acid generator;
patternwise exposing said resist layer to radiation, to generate acid in exposed regions of said resist layer;
removing patternwise soluble portions of said resist layer to form a pattern of spaces in said resist layer; and
transferring said pattern of spaces to said substrate,
wherein said polymer is selected from a group consisting of polyacrylates, polymethacrylates, polycyclicolefins, cyclicolefine-maleic anhydride copolymers, and a mixture thereof, and
wherein said nonpolymeric silsesquioxane is present in a range from more than 10 wt % to 94 wt % of solids in said composition.

14. The method of claim 13, further comprising:
baking the exposed resist layer to promote acid-catalyzed reaction in exposed portions of said resist layer subsequent to said patternwise exposing said substrate.

15. The method of claim 13, further comprising:
forming a planarizing layer over said substrate, said resist layer being applied directly to said planarizing layer.

16. The method of claim 13, wherein said transferring said pattern comprises performing an anisotropic etch to transfer said pattern.

17. The method of claim 13, wherein said patternwise exposing said resist layer to said radiation generates said acid such that said acid labile moiety in said nonpolymeric silsesquioxane is cleaved from said nonpolymeric silsesquioxane.

18. A radiation-sensitive composition, comprising:
a nonpolymeric silsesquioxane comprising at least one aqueous base soluble moiety;
a polymer comprising an aqueous base soluble moiety;
a crosslinker; and
a radiation-sensitive acid generator,
wherein said polymer is selected from a group consisting of polyacrylates, polymethacrylates, polycyclicolefins, cyclicolefine-maleic anhydride copolymers, and a mixture thereof, and
wherein said nonpolymeric silsesquioxane is present in a range from more than 10 wt % to 94 wt % of solids in said composition.

19. The radiation-sensitive composition of claim 18, wherein said nonpolymeric silsesquioxane is selected from a group consisting of:
a polyhedral silsesquioxane optionally having one to three open vertices; and
a macromer of two to four polyhedral silsesquioxanes that may be the same or different, with each polyhedral silsesquioxane optionally having one to three open vertices.

20. The radiation-sensitive composition of claim 19, wherein said polyhedral silsesquioxane comprises from 4 to 10 faces.

21. The radiation-sensitive composition of claim 18, wherein said aqueous base soluble moiety is selected from a group consisting of a hydroxyl, a fluoroalcohol, a carboxylic acid, an amino group, and an imino group.

22. The radiation-sensitive composition of claim 18, wherein said radiation-sensitive acid generator is selected from a group consisting of nitrobenzyl compounds, sulfonium salts, iodonium salts, sulfonates and carboxlates.

23. A method of fabricating a device, said method comprising:
applying a radiation-sensitive composition to a substrate to form a resist layer on said substrate, said radiation-sensitive composition comprising:
a nonpolymeric silsesquioxane comprising at least one aqueous base soluble moiety;
a polymer comprising an aqueous base soluble moiety;
a crosslinker; and
a radiation-sensitive acid generator;
patternwise exposing said resist layer to radiation, to generate acid in exposed regions of said resist layer;
removing patternwise soluble portions of said resist layer to form a pattern of spaces in said resist layer; and
transferring said pattern of spaces to said substrate,
wherein said polymer is selected from a group consisting of polyacrylates, polymethacrylates, polycyclicolefins, cyclicolefine-maleic anhydride copolymers, and a mixture thereof, and
wherein said nonpolymeric silsesquioxane is present in a range from more than 10 wt % to 94 wt % of solids in said composition.

24. The method of claim 23, further comprising:
baking the exposed resist layer to promote acid-catalyzed reaction in exposed portions of said resist layer subsequent to said patternwise exposing of said substrate.

25. The method of claim 23, further comprising:
forming a planarizing layer over said substrate, said resist layer being applied directly to said planarizing layer.

26. The method of claim 23, wherein said transferring said pattern comprises performing an anisotropic etch to transfer said pattern.

27. A radiation-sensitive composition, comprising:
a nonpolymeric silsesquioxane comprising at least one acid labile moiety;
a polymer comprising at least one member selected from a group consisting of an aqueous base soluble moiety and an acid labile moiety; and
a radiation-sensitive acid generator,
wherein said nonpolymeric silsesquioxane is present in a range from more than 10 wt % to 94 wt. % of solids in said composition, and
wherein said polymer is selected from a group consisting of polyacrylates, polymethacrylates, polycyclicolefins, cyclicolefine-maleic anhydride copolymers, and thereof.

28. A radiation-sensitive composition, comprising:
a nonpolymeric silsesquioxane comprising at least one acid labile moiety;

a polymer comprising at least one member selected from a group consisting of an aqueous base soluble moiety and an acid labile moiety; and a radiation-sensitive acid generator, wherein said polymer is present in a range from 5 wt % to 91 wt % of solids contained in said composition, and wherein said polymer is selected from a group consisting of polyacrylates, polymethacrylates, polycyclicolefins, cyclicolefine-maleic anhydride copolymers, and a mixture thereof, and wherein said nonpolymeric silsesquioxane is present in a range from more than 10 wt % to 94 wt % of solids in said composition.

* * * * *